United States Patent [19]

Miyoshi

[11] Patent Number: 4,461,038
[45] Date of Patent: Jul. 17, 1984

[54] TELEVISION TUNER CIRCUIT

[76] Inventor: Teijiro Miyoshi, 29-303, 12 ban, Miigaoka 1-chome, Neyagawashi, Osaka, Japan

[21] Appl. No.: 403,504
[22] PCT Filed: Nov. 12, 1981
[86] PCT No.: PCT/JP81/00330
§ 371 Date: Jul. 14, 1982
§ 102(e) Date: Jul. 14, 9182
[87] PCT Pub. No.: WO82/01796
PCT Pub. Date: May 27, 1982

[30] Foreign Application Priority Data
Nov. 14, 1980 [JP] Japan .................. 55-163763

[51] Int. Cl.³ .............................. H04B 1/26
[52] U.S. Cl. ...................... 455/176; 455/188; 455/190; 334/15
[58] Field of Search ........... 455/180, 176, 188–191; 334/15

[56] References Cited
U.S. PATENT DOCUMENTS
3,794,924  2/1974  Furuya et al. ................ 455/191
4,189,678  2/1980  Sakamoto ..................... 455/191
4,291,290  9/1981  Ijichi ............................ 455/190
4,326,295  4/1982  Matsumoto ................... 455/188

Primary Examiner—Jin F. Ng
Attorney, Agent, or Firm—Armstrong, Nikaido, Marmelstein & Kubovcik

[57] ABSTRACT

A tuner used in a television receiver or the like, when one supply voltage is given as a band switching voltage from a one-circuit triple-contact switch to selectively switch a VHF low band, a VHF high-band or a UHF band, a second contact of the switch selected for setting the VHF high band is connected through a second switching diode to the node of a high-frequency grounding condenser and a first switching diode for switching a tuning coil at a VHF input tuning circuit, a third contact of the switch selected for setting the UHF band is connected to the above node through a third switching diode so as to turn on the first switching diode even when receiving the UHF band, thereby generating no harmonic wave of VHF signal from a VHF input circuit by the first switching diode and no noise in the picture and also performing the setting of other bands without hindrance.

4 Claims, 1 Drawing Figure

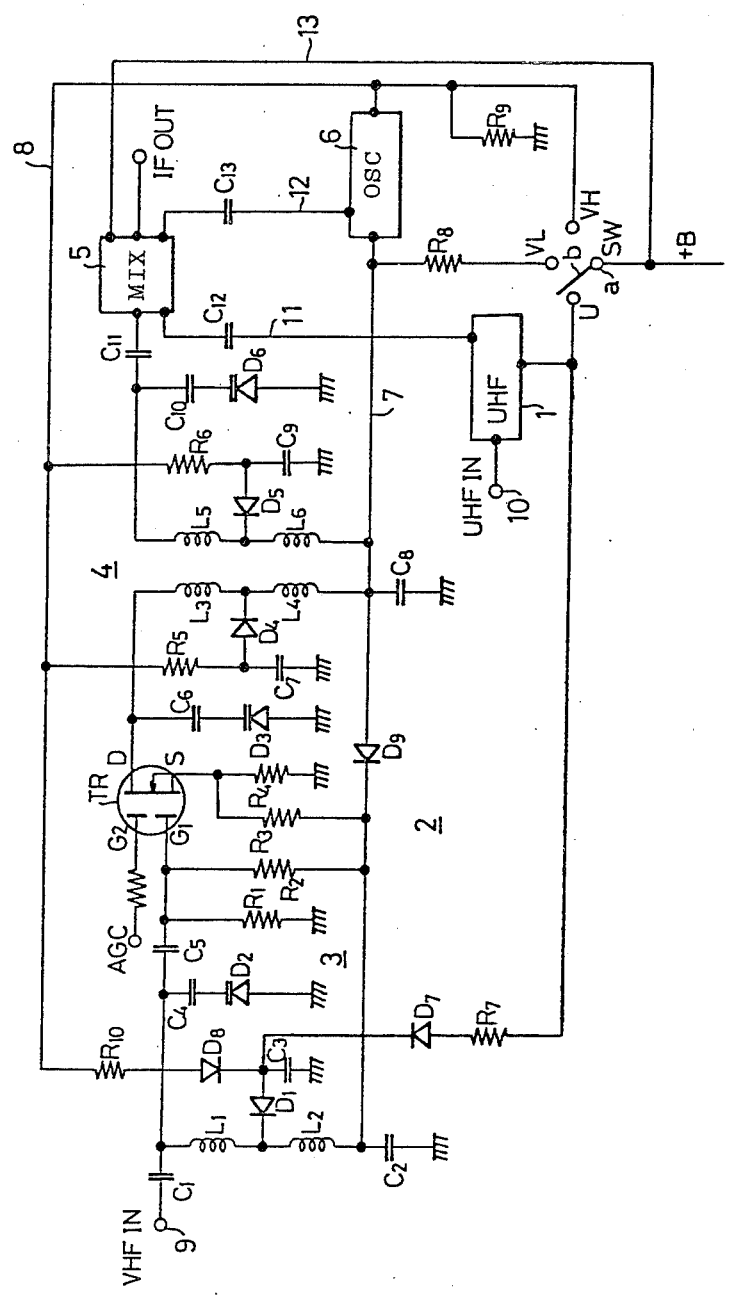

TELEVISION TUNER CIRCUIT

FIELD OF THE INVENTION

This invention relates to a tuner used in a television receiver or the like, and more particularly to a tuner which is performable of band switching by use of a one-circuit triple-contact switch.

BACKGROUND OF THE INVENTION

Generally, a tuner for a television receiver or the like, employing a variable capacity diode as a tuning element, has a band switching circuitry which selectively switches a VHF low band, a VHF high band and a UHF band. Therefore, from the viewpoint of simplifying an electric power source for switching the band, it has been proposed that the one circuit triple-contact switch, which applies DC supply voltage selectively to each contact for the VHF low-band, VHF high band or UHF band to perform the band switching, is used for switching voltage.

The band switching mechanism in the conventional turner using the one-circuit triple-contact switch, however, has a switching diode at a VHF tuner unit kept in not-biased condition when UHF is received, so that a VHF signal at high level given to a VHF input terminal, especially the non-linearity of the switching diode in a VHF input tuning circuit, generates the harmonic frequency identical with the UHF band, resulting in that the harmonic wave is given into the input side at the UHF tuner unit to appear as noises in the picture. Such phenomenon is remarkable in a case that the VHF tuner unit and UHF tuner unit are encased in the same casing or the UHF and VHF signals from the antenna are divided by a frequency divider to be led to the VHF input terminal and UHF input terminal respectively. The reason for the former case is that the harmonic wave is easy to jump from the periphery of the switching diode to the input side of the UHF tuner unit in the casing, and that for the latter case is that the harmonic wave generated by the switching diode enters the UHF input terminal from the VHF input terminal through an external frequency divider. Hence, a turner having both the above constructions in combination is further remarkable of the above trouble.

SUMMARY OF THE INVENTION

In the light of the above problems in the conventional tuner, this invention has been designed. An object of the invention is to provide a tuner which allows a tuning coil switching diode at a VHF input tuning circuit to be conductive when receiving the UHF band, thereby generating no harmonic wave, and which actually has such construction to switch the band in the one-circuit triple-contact system without hindrance.

In order to attain the above object, the present invention applies supply voltage to a common contact at the one-circuit triple-contact switch, the common contact connecting the compound circuit. A first contact of the switch is connected to turn on a local oscillator and a radio frequency amplifying transistor in the VHF tuner unit, a second contact of the switch is connected to actuate tuning coil switching diodes and a radio frequency amplifying transistor and a local oscillator in an interstage tuning circuit of the VHF tuner unit, and connected to apply conducting voltage for a first switching diode through a second switching diode to the node of the first switching diode turned on to void a coil for a low band at the VHF input tuning circuit and a high-frequency grounding condenser, and a third contact of the switch is connected to a UHF tuner unit and also connected through a third switching diode to the node of the first switching diode and a high-frequency grounding condenser, thereby turning on the first switching diode when receiving the UHF band.

In the tuner having the band switching mechanism employing the one-circuit triple-contact switch as foregoing, the tuning coil switching diode in the VHF input tuning circuit is turned on without being not-biased while receiving the UHF band, whereby, even when the VHF signal is given, no equivalent harmonic wave is generated by said switching diode in the UHF band, thus producing no noise in the picture.

Furthermore, the first switching diode for switching the tuning coil at the VHF input tuning circuit, when the UHF band is received, as abovementioned, is turned on by being given supply voltage from the third contact of the switch through the third switching diode. Hence, when the band other than the UHF band is received, the input tuning circuit and the third contact side are cut off by the third switching diode not to affect the UHF tuner unit. When the VHF high-band is received, the first switching diode is given drive voltage therefor from the second contact through the second switching diode, whereby when the UHF band is received, the input tuning circuit and the second contact are cut off by the second switching diode, thus not affecting the RF amplifier and local oscillator. Moreover, in the input tuning circuit, the second and third switching diodes are both connected to the high-frequency grounding condensers, so that both the diodes, even when turned off, will produce no harmonic wave.

These and other objects of the invention will become more apparent in the detailed description and examples which follow.

BRIEF DESCRIPTION OF THE DRAWING

The drawing is a circuit diagram of an embodiment of a tuner of the invention.

DETAILED DESCRIPTION OF THE PREFERRED EMBODIMENT

This invention will be detailed concretely in accordance with the accompanying drawing, in which reference SW denotes a one-circuit triple-contact switch having a movable part b connected to a common contact a and capable of connecting selectively with a first contact VL, a second contact VH, and a third contact U. Alternatively, any switch employing transistors or diode elements to be formed in an electronic circuitry manner, other than the above switch having the mechanically movable part b, may of course be available, so that the one-circuit triple-contact switch described herewith will include such electronically acting switch.

Reference numeral 1 denotes a UHF tuner unit given a UHF signal from an input terminal 10, and 2 denotes a VHF tuner unit except for the switch SW portion, both the tuner units being encased within the same box-like casing through a printed substrate. An interval construction of UHF tuner unit 1 is not concretely shown, but the VHF tuner unit 2 is shown in detail of an input tuning circuit 3 and an interstage tuning circuit 4 and in block of a mixed circuit 5 and a local oscillator 6. References $D_2$, $D_3$ and $D_6$ denote variable capacity diodes, where tuning voltage supply lines thereto are omitted, TR denotes a radio frequency (RF) amplifying transistor, in which a first gate $G_1$ is given a RF signal selected by the input tuning circuit 3, and a second gate $G_2$ is given auto-frequency control voltage from a terminal AGC, $L_1$, $L_3$, and $L_5$ denote tuning coils for the VHF high-band, $L_2$, $L_4$ and $L_6$ denote tuning coils acting together with the coils $L_1$, $L_3$ and $L_5$ when VHF low-band is received, $D_1$, $D_4$ and $D_5$ denote switching diodes for switching the tuning coils, and $C_1$ to $C_{13}$ denote condensers for DC cut-off and almost negligible of impedance with respect to the signals given to the condensers respectively.

The first contact VL at the one-circuit triple-contact switch SW is connected to the local oscillator 6 and the line 7. The line 7 is connected to the node of a condenser 8 and the cold sides of tuning coils $L_4$ and $L_6$ and further to the node of bias resistances $R_2$ and $R_3$ of the RF transistor, tuning coil $L_2$ and condenser $C_2$, through a fourth switching diode $D_9$ interposed in polarity as shown.

The second contact VH of the switch SW is connected to one ends of resistances $R_9$ and $R_{10}$, the other end of resistance $R_9$ being grounded and the other end of resistance $R_{10}$ being connected to the anode of a second switching diode 8, the cathode thereof being connected to the node of the first switching diode $D_1$ and high-frequency grounding condenser $C_3$. Also, the second contact VH is connected to resistances $R_5$ and $R_6$ through the line 8 as shown.

The third contact U of switch SW is connected to the UHF tuner unit 1 and to the node of the first switching diode $D_1$ and second switching diode $D_8$ through a current limiting resistance $R_7$ and third switching diode $D_7$. The output line 11 of UHF tuner unit 1 is connected to the mixed circuit 5 through a coupling condenser 12 and the output line 12 of local oscillator 6 is connected also to the mixed circuit 5 through a coupling condenser $C_{13}$.

The common contact a of switch SW is given DC supply voltage (+B), which is fed always to the mixed circuit 5 via the line 13 to thereby keep the mixed circuit 5 in an actuated condition regardless of the band switching, which purposes allowing the mixed circuit 5 to operate as an amplifier for an intermediate frequency (IF) output of UHF tuner when receiving the UHF band.

In the abovementioned tuner, when the movable part b at the one-circuit triple-contact switch SW connects with the first contact VL, the drain D of RF amplifying transistor TR is given the supply voltage (+B) through the line 7 and the tuning coils $L_4$ and $L_3$ and the first gate $G_1$ and source S of transistor TR are under bias by a current flowing through the fourth switching diode $D_9$ and resistances $R_2$ and $R_1$ and those $R_3$ and $R_4$, whereby the RF amplifying transistor TR is actuated, at which time the switching diodes $D_1$, $D_8$, $D_4$ and $D_5$ are under inverted bias not to be conductive. The local oscillator 6 also is given the supply voltage (+B) through a resistance $R_8$ and actuated to feed its local oscillation signal to the mixed circuit 5, at which time the oscillator 6 is adapted to be set in the low band state by the supply voltage (+B) given from the first contact VL. The mixed circuit 5 outputs from its IF output terminal IFOUT an intermediate frequency signal generated by the beat caused by the RF signal of the VHF low band given from the VHF input terminal 9 through the input tuning circuit 3, RF amplifying transistor TR and interstage tuning circuit 4 and by the local oscillation signal from the local oscillator 6.

Next, when the movable part b connects with the second contact VH of one-circuit triple-contact switch SW, the local oscillator 6 is given the operating voltage (+B) through the line 8, the voltage setting the local oscillator 6 in the high-band stage.

Further, the drain of RF amplifying transistor TR is given voltage from the line 8 via resistance 5, switching diode $D_4$ and tuning coil $L_3$, and a current flows from the line 8 to the switching diode $D_8 \rightarrow$ that $D_1 \rightarrow$ tuning coil $L_2 \rightarrow$ resistances $R_2$, $R_3 \rightarrow$ resistances $R_1$, $R_4$ and from the line 8 to the resistance $R_5 \rightarrow$ switching diode $D_4 \rightarrow$ tuning coil $L_4 \rightarrow$ 4th switching diode $D_9 \rightarrow$ resistances $R_2$, $R_3 \rightarrow$ resistances $R_1$, $R_4$ and from the line 8 to the resistance $R_6 \rightarrow$ switching diode $D_5 \rightarrow$ tuning coil $L_6 \rightarrow$ 4th switching diode $D_9 \rightarrow$ resistances $R_2$, $R_3 \rightarrow$ resistances $R_1$, $R_4$, whereby the RF amplifying transistor TR is given bias at its first gate $G_1$ and source S so as to be put in the actuated condition, at which time the switching diodes $D_1$, $D_4$ and $D_5$ are on to put the tuning coils $L_2$, $L_4$ and $L_6$ in an inactive condition in connection with the high frequency through the condensers $C_3$, $C_7$ and $C_9$, whereby the tuner is kept in the state of receiving the VHF high-band.

Next, when the movable part b connects with the third contact U of one-circuit triple-contact switch SW, the UHF tuner unit 1 is given the operating voltage (+B) to be actuated and a current flows through the third switching diode $D_7 \rightarrow$ first switching diode $D_1 \rightarrow$ tuning coil $L_2 \rightarrow$ resistances $R_2$, $R_3 \rightarrow$ resistances $R_1$, $R_4$ to thereby turn on the first switching diode $D_1$. In such state that the first switching diode $D_1$ is under bias in the forward direction so as to be conductive, even when the VHF signal is given, the switching diode $D_1$ scarcely generates the harmonic wave. In addition, the second switching diode $D_8$ and fourth switching diode $D_9$ interrupt the drain of RF amplifying transistor TR and the local oscillator 6 from being given the operating voltage, while the third switching diode $D_7$ serves to interrupt the UHF tuner unit 1 from being given the operating voltage when the VHF high-band is received.

In the drawing, a conducting current for the switching diode $D_1$, when receiving the UHF, flows to the earth through the tuning coil $L_2$, resistances $R_2$, $R_1$ and resistances $R_3$, $R_4$ to apply bias between the first gate $G_1$ and the source S of amplifying transistor TR, but the drain thereof is not under bias due to the cutoff of the fourth switching diode $D_9$, thereby keeping the amplifying transistor TR in off-condition. The bias resistance of amplifying transistor TR is used as the return circuit for the conducting current for the switching diode $D_1$, alternatively the fourth switching diode $D_9$ may be interposed on the line connecting the tuning coil $L_2$ and resistance $R_2$ and a return circuit resistance may be interposed between the cathode of diode $D_9$ and the earth to thereby flow the current to the earth through the return circuit resistance.

When the movable contact b connects with the first contact VL at the one-circuit triple-contact switch SW to receive the VHF low-band, the fourth switching diode $D_9$ is biased in the forward direction, but the switching diodes $D_1$, $D_4$, $D_5$, $D_7$ and $D_8$ are all biased in the backward directions. In case that the switching diodes $D_1$, $D_7$ and $D_8$ are extremely different in the inverted impedance, there is the probability that the diode $D_1$ is not sufficiently biased in the backward direction. In such case, each of diodes $D_1$ and $D_7$ or $D_1$ and $D_8$ is connected in parallel to a high resistance, so that the anode potential of $D_1$ need only be decided.

While the invention has been described in the preferred embodiment, it is to be understood that the scope of this invention is of course not limited to the above embodiment except as defined in the following claim.

What is claimed is:

1. A tuner device which uses a variable capacity diode as a tuning element, switches one supply voltage by a single-pole, triple-throw switch having a common contact, first, second and third contacts so as to be set selectively in a VHF-low-band, a VHF high-band and a UHF band, and, when receiving the UHF band, uses a mixer circuit in a VHF tuner unit as an amplifier for an intermediate frequency of a UHF tuner unit, said VHF tuner unit having a VHF input tuner, radio frequency amplifier, interstage tuner, and mixer, connected in the above-mentioned order, said VHF tuner comprising a low and a high band tuning coil;

said supply voltage being connected to said common contact of said switch and said mixer;

said first contact of said switch being connected to a local oscillation circuit and, by way of biasing means, to the radio frequency amplifier in said VHF tuner unit to thereby turn on said local oscillation circuit and radio frequency amplifier;

said second contact of said switch being connected to intermediate switching diodes which are thereby connected to tuning coils in said interstage tuner for switching on said tuning coils, said second contact being also connected by way of a biasing means to said radio frequency amplifier and connected to said local oscillation circuit to thereby actuate said radio frequency amplifier and local oscillation circuit, said second contact being connected to a circuit node, said node being connected in common to a high-frequency grounding condenser and the anode of a first switching diode, said second contact applying to said node a conduction voltage for the first switching diode through a second switching diode to void said low band coil at said VHF input tuner; and said third contact of said switch being connected to said UHF tuner unit and also to the node of said first switching diode and high-frequency grounding condenser through a third switching diode, thereby turning on said first switching diode when receiving the UHF band.

2. The tuner device of claim 1, wherein said biasing means connected to said first contact is a pair of biasing resistors.

3. The tuner device of claim 1, wherein said second contact of said switch is connected to said second switching diode through a resistance and is connected to said intermediate switching diodes each through a resistor.

4. The tuner device of claim 1, wherein said third contact of said switch is connected to said third switching diode through a resistor.

* * * * *